United States Patent
Wayman

(10) Patent No.: US 8,051,896 B2
(45) Date of Patent: Nov. 8, 2011

(54) APPARATUS FOR SPREADING HEAT OVER A FINNED SURFACE

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 1134 days.

(21) Appl. No.: 11/831,543

(22) Filed: Jul. 31, 2007

(65) Prior Publication Data

US 2009/0032217 A1    Feb. 5, 2009

(51) Int. Cl.
    *H05K 7/20* (2006.01)
(52) U.S. Cl. ........ 165/80.3; 257/720; 165/185; 361/704
(58) Field of Classification Search ................. 165/80.3, 165/185; 257/720; 361/704, 710
    See application file for complete search history.

(56) References Cited

U.S. PATENT DOCUMENTS

| | | | |
|---|---|---|---|
| 3,163,207 A | 12/1964 | Schultz | |
| 3,220,471 A | 11/1965 | Coe | |
| 3,312,277 A * | 4/1967 | Chitouras et al. | 165/185 |
| 3,359,461 A | 12/1967 | Schuler et al. | |
| 3,566,959 A | 3/1971 | Koltuniak | |
| 4,369,838 A | 1/1983 | Asanuma | |
| 5,134,545 A | 7/1992 | Smith | |
| 5,494,753 A | 2/1996 | Anthony | |
| 5,504,653 A | 4/1996 | Murphy et al. | |
| 5,863,467 A | 1/1999 | Mariner et al. | |
| 5,958,572 A | 9/1999 | Schmidt et al. | |
| 5,969,949 A | 10/1999 | Kim et al. | |
| 6,046,498 A * | 4/2000 | Yoshikawa | 257/706 |
| 6,097,598 A * | 8/2000 | Miyahara et al. | 361/704 |
| 6,104,090 A | 8/2000 | Unger et al. | |
| 6,131,651 A | 10/2000 | Richey, III | |
| 6,257,328 B1 | 7/2001 | Fujiwara et al. | |
| 6,407,922 B1 | 6/2002 | Eckblad et al. | |
| 6,469,381 B1 | 10/2002 | Houle et al. | |
| 6,585,925 B2 | 7/2003 | Benefield | |
| 6,661,317 B2 | 12/2003 | Ali et al. | |
| 6,680,015 B2 | 1/2004 | McCullough | |
| 6,691,768 B2 | 2/2004 | Hsieh et al. | |
| 6,758,263 B2 | 7/2004 | Krassowski et al. | |
| 6,771,502 B2 * | 8/2004 | Getz et al. | 361/703 |
| 6,779,593 B1 | 8/2004 | Hegde | |
| 6,859,367 B2 | 2/2005 | Davison | |
| 6,896,045 B2 * | 5/2005 | Panek | 165/185 |
| 6,898,084 B2 * | 5/2005 | Misra | 361/710 |
| 6,918,438 B2 | 7/2005 | Ellsworth, Jr. | |
| 6,977,814 B2 * | 12/2005 | Hornung | 361/690 |

(Continued)

OTHER PUBLICATIONS

"TC1050 Thermal Management Materials", GE Advanced Ceramics, Sep. 2003, pp. 1-2, Publisher: General Electric Company.

(Continued)

*Primary Examiner* — Allen Flanigan
(74) *Attorney, Agent, or Firm* — Fogg & Powers LLC

(57) ABSTRACT

An apparatus for spreading heat over a plurality of fins is provided. The apparatus includes a heat dissipating member composed of metal and having a plurality of fins on a first side of the heat dissipating member. The apparatus also includes a plurality of strips of thermal material having a thermal conductivity in a direction parallel to the heat dissipating member higher than a thermal conductivity of the heat dissipating member, the plurality of strips disposed on a side of the heat dissipating member opposite of the first side and configured to spread heat along the heat dissipating member.

24 Claims, 3 Drawing Sheets

U.S. PATENT DOCUMENTS

| | | |
|---|---|---|
| 6,982,874 B2 | 1/2006 | Smale et al. |
| 7,053,295 B2 | 5/2006 | Murasawa |
| 7,086,451 B2 * | 8/2006 | Leu et al. ............... 165/80.3 |
| 7,108,055 B2 | 9/2006 | Krassowski et al. |
| 7,176,564 B2 | 2/2007 | Kim |
| 7,195,951 B2 | 3/2007 | Houle et al. |
| 7,202,309 B2 | 4/2007 | Furrer et al. |
| 7,219,721 B2 | 5/2007 | Miyazaki et al. |
| 7,220,485 B2 | 5/2007 | Sayir et al. |
| 7,221,860 B2 | 5/2007 | Fujimura et al. |
| 7,307,844 B2 | 12/2007 | Wu |
| 7,328,508 B2 | 2/2008 | Edwards et al. |
| 7,349,214 B2 | 3/2008 | Jeong |
| 7,431,072 B2 | 10/2008 | Miyazaki et al. |
| 7,446,412 B2 | 11/2008 | Gwin |
| 7,539,019 B2 | 5/2009 | Wayman et al. |
| 2002/0172009 A1 | 11/2002 | Ikushima et al. |
| 2002/0179287 A1 * | 12/2002 | Graf et al. ............... 165/80.3 |
| 2003/0116312 A1 * | 6/2003 | Krassowski et al. ...... 165/185 |
| 2004/0134646 A1 * | 7/2004 | Chu et al. ................ 165/185 |
| 2004/0177947 A1 | 9/2004 | Krassowski et al. |
| 2004/0223303 A1 | 11/2004 | Hornung |
| 2005/0006054 A1 * | 1/2005 | Miyazaki et al. ......... 165/80.3 |
| 2005/0167085 A1 | 8/2005 | Chu |
| 2006/0063018 A1 | 3/2006 | Krassowski |
| 2006/0086493 A1 | 4/2006 | Fujiwara et al. |
| 2007/0053168 A1 | 3/2007 | Sayir et al. |
| 2007/0062676 A1 * | 3/2007 | Yao ..................... 165/104.33 |
| 2007/0086196 A1 | 4/2007 | Wong |
| 2007/0107872 A1 | 5/2007 | Miyazaki et al. |
| 2007/0108595 A1 | 5/2007 | Refai-Ahmed |
| 2007/0257359 A1 | 11/2007 | Reis et al. |
| 2009/0032217 A1 | 2/2009 | Wayman |
| 2009/0032218 A1 | 2/2009 | Wayman |
| 2009/0032234 A1 | 2/2009 | Wayman et al. |
| 2009/0141452 A1 | 6/2009 | Wayman |

OTHER PUBLICATIONS

"TPG Thermal Management Material", GE Advanced Ceramics, Sep. 2003, pp. 1-2, Publisher: General Electric Company.

DTI Global Watch Mission Report, "Developments and Trends in Thermal Management Technologies—a Mission to the USA", Feb. 2007, Publisher: Pera on behalf of Department of Trade and Industry.

Motesano, Mark J., "Annealed Pyrolytic Graphite", Jun. 2006, Publisher: Advanced Materials & Processes.

* cited by examiner

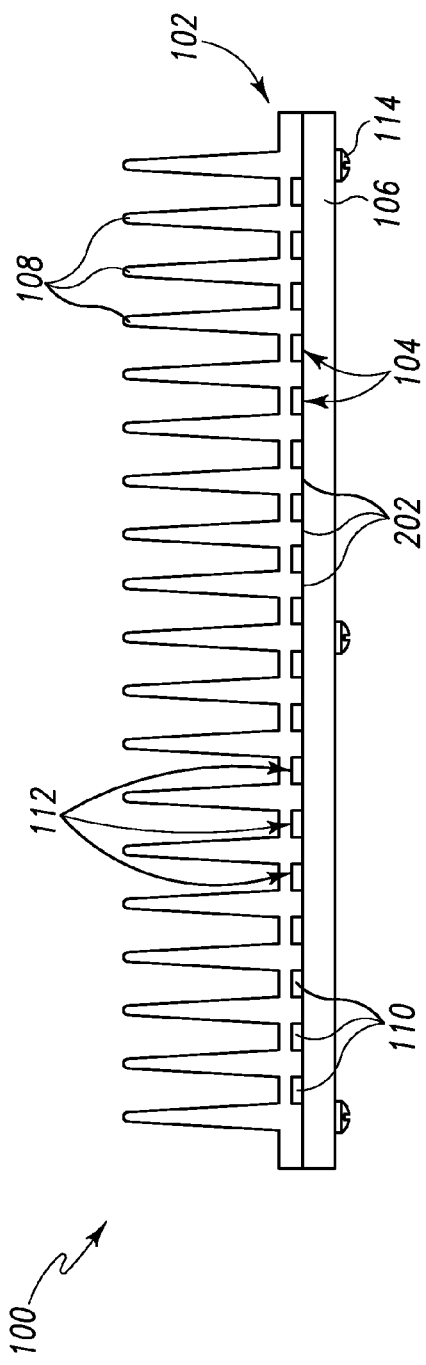
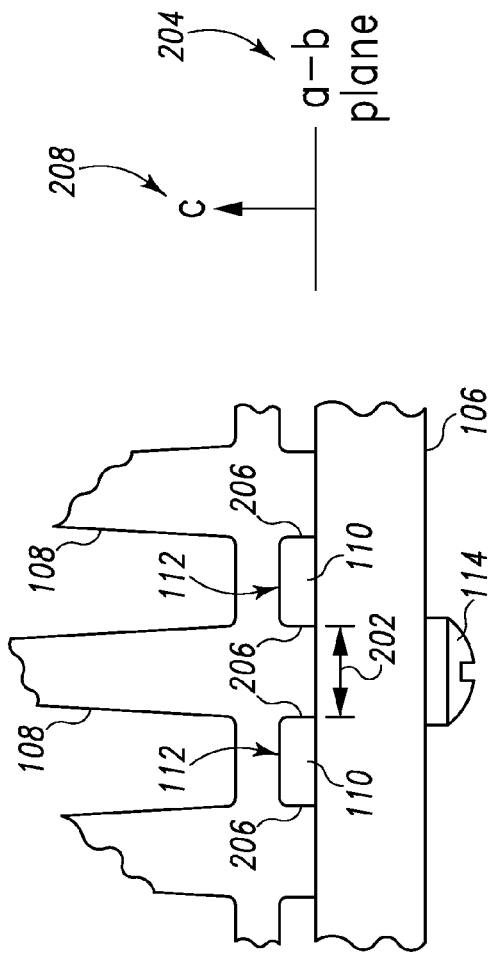
Fig. 2A
Fig. 2B

APPARATUS FOR SPREADING HEAT OVER A FINNED SURFACE

BACKGROUND

For many devices removing heat is essential in order to keep the device operating effectively. Often, to aid in removal of heat, a heat sink is coupled to the device. The heat sink is generally a metal component with a flat base on one side and a number of fins on the other. The flat base is coupled to the device and the fins extend out from the base into the surrounding environment. The fins increase the surface area available for heat dissipation and aid in drawing air past the heat sink. Often, however, heat from the electronic device does not propagate evenly from the heat generating device to all areas of the heat sink. This results in localized "hot spots" which generally occur near where the heat is coupled into the heat sink. Because of the thermal conductivity of the metal heat sink, generally the heat does not adequately spread from the hot spot. This results in some areas on the heat sink being unused, or dissipating heat only minimally. Thus, the heat sink is not cooling up to its potential, because the heat is being dissipated from only a portion of the surface area on the heat sink.

The heat dissipation problems are increased when using heat sinks with electronic devices, because many electronic devices generate a large amount of heat in a small area. For the reasons stated above, and for other reasons stated below which will become apparent to those skilled in the art upon reading and understanding the present specification, there is a need in the art for an apparatus and method for improving the heat dissipation of a finned surface.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention. In one embodiment, an apparatus for spreading heat over a plurality of fins is provided. The apparatus includes a heat dissipating member composed of metal and having a plurality of fins on a first side of the heat dissipating member. The apparatus also includes a plurality of strips of thermal material having a thermal conductivity in a direction parallel to the heat dissipating member higher than a thermal conductivity of the heat dissipating member, the plurality of strips disposed on a side of the heat dissipating member opposite of the first side and configured to spread heat along the heat dissipating member.

BRIEF DESCRIPTION OF THE DRAWINGS

The present invention can be more easily understood, and further advantages and uses thereof are more readily apparent, when considered in view of the detailed description and the following figures in which:

FIG. 2A is a cross-sectional view of the heat sink of FIG. 1;

FIG. 2B is an enlarged cross-sectional view of the heat sink of FIG. 2A; and

In accordance with common practice, the various described features are not drawn to scale but are drawn to emphasize specific features relevant to the present invention.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for an apparatus for improving the heat dissipation of a finned surface. The apparatus includes a finned surface and a plurality of strips of a thermal material for spreading the heat across the finned surface. Some embodiments provide for a finned surface with fins oriented parallel to each other. Strips of thermal material are oriented parallel with the fins and are positioned such that heat released from the thermal material flows easily into a nearby fin. Thus, the strips of thermal material aid in spreading heat along each fin. Other embodiments provide for a cross strips of thermal material in addition to the parallel strips of thermal material. The cross strips aid in spreading heat across different fins. Some embodiments of the apparatus have a generic heat spreading design which allows the apparatus to be applied to many different layouts of heat generating devices.

Figure 1:
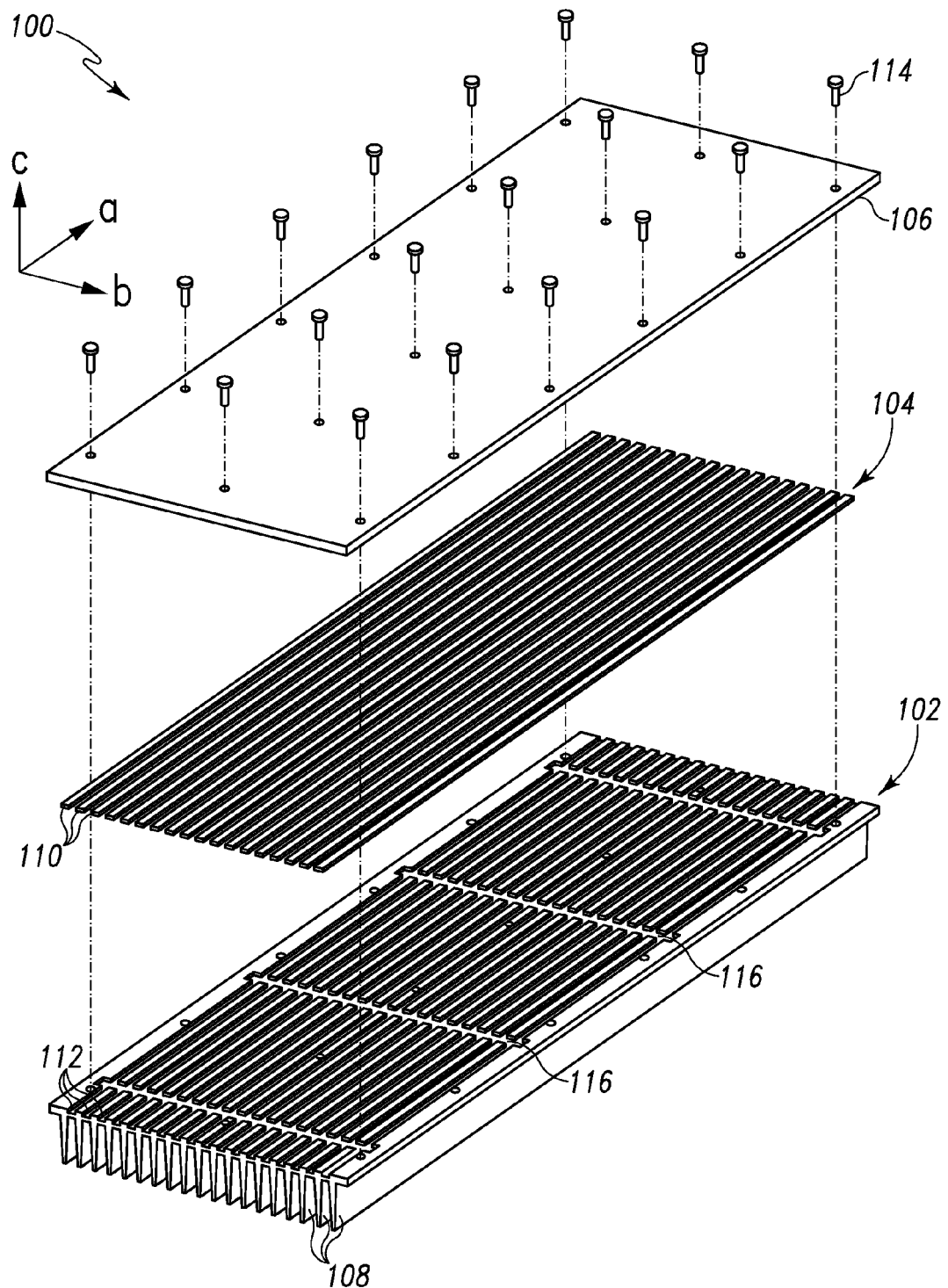
FIG. 1 is an exploded view of one embodiment of a heat sink that spreads heat over a finned surface.

FIG. 1 is an exploded view of one embodiment of a heat sink 100 that spreads heat across a finned surface. Heat sink 100 includes a finned section 102, a thermal material 104, and a base 106. Finned section 102 has a plurality of fins 108 projecting out normal to the surface of heat sink 100, extending along one side of finned section 102, and having a pointed ridge shape. In the embodiment shown, fins 108 are oriented parallel to each other. In an alternative embodiment, fins 108 are oriented in an asterisk shape such that one end of each fin is near the center of finned surface 102 and fins 108 extend outward in different directions from the center. In other embodiments, fins 108 are oriented in a parallel diagonal manner or in other patterns as known to those skilled in the art. In still other embodiment, fins 108 are obelisk type structures, or other shapes as known to those skilled in the art.

In one embodiment, finned section 102 is composed of solid aluminum. In an alternative embodiment, finned section 102 is composed of steel. In other embodiments, finned section 102 is composed of other conductive materials or a combination of conductive materials.

In the embodiment shown in FIG. 1, thermal material 104 is disposed on finned section 102 on a side opposite of fins 108. Thermal material 104 aids in distributing heat throughout finned section 102. Thermal material 104 is a material having a higher thermal conductivity than that of finned section 102, thus heat propagates through thermal material 104 more easily than through finned section 102. In one embodiment, thermal material 102 comprises a plurality of strips 110. Each strip 110 of material is spaced from adjacent strips and extends in a direction parallel with fins 108 of finned section 102.

Finned section 102 comprises a plurality of grooves 112 to house each strip 110 of thermal material 104. Grooves 112 are defined in finned section 102 on a side opposite of fins 108 and extend in a direction parallel to fins 108. In the embodiment shown in FIG. 1, cross grooves 116 are also defined in finned section 102 and will be described in more detail below. Each strip 110 of thermal material 104 is housed in a groove 112 and base 106 covers each strip 110 of thermal material 104. A plurality of fasteners 114 secure base 106 to finned section 102, thereby securing thermal material 104 between base 106 and finned section 102. In one embodiment, fasteners 114 are screws. In alternative embodiments, fasteners 114 are rivets, clamps, or other structures as known to those skilled in the art.

Thermal material 104 is thermally coupled to finned section 102. Thus, heat can propagate into thermal material 104, spread across heat sink 100 and couple into finned section 102. In one embodiment, heat sink 100 dissipates heat from one or more heat generating devices (not shown) which are thermally coupled to base 106. As the devices generate heat, the heat is coupled into base 106. The heat propagates from base 106 into finned section 102 and thermal material 104. Due to the high thermal conductivity of thermal material 104, the heat in thermal material 104 can easily propagate from one area along the particular strip 110 of thermal material 104 to another area, thus spreading the heat across heat sink 100. Each strip 110 of thermal material 102 acts as a corridor through which heat can propagate along finned section 102. In one embodiment, the heat generating devices are electronic devices mounted on base 106.

In one embodiment, thermal material 104 is thermal pyrolytic graphite (TPG), which is commercially available from Momentive Performance Materials in Wilton, Conn. TPG may be referred to as highly oriented pyrolytic graphite (HOPG), or compression annealed pyrolytic graphite (CAPG). In any case, TPG refers to graphite materials consisting of crystallites of considerable size, the crystallites being highly aligned or oriented with respect to each other and having well ordered carbon layers or a high degree of preferred crystallite orientation, with an in-plane (a-b direction as shown in FIG. 1) thermal conductivity greater than 1000 W/m-K. In one embodiment, the TPG has an in-plane thermal conductivity of approximately 1,500 W/m-K.

Although TPG has a high thermal conductivity in the a-b direction, its thermal conductivity in a direction normal to that plane (c direction) is low. For example, in one embodiment, TPG has a c direction thermal conductivity of less than 20 W/m-K. TPG, therefore, rapidly spreads heat in the a-b direction, but resists heat flow in the c direction.

In one embodiment, TPG is formed as described in U.S. Pat. No. 5,863,467 which is hereby incorporated herein by reference. Briefly, to manufacture heat sink 100 with TPG, pyrolytic graphite is deposited in grooves 112, base 106 is positioned overtop, and heat sink 100 is heat treated to form the pyrolytic graphite into a crystal structure. The resulting crystal structure, TPG, has a high in plane conductivity.

Referring now to FIGS. 2A and 2B, a cross-sectional view of one embodiment of heat sink 100 in which TPG is used as thermal material 104. FIGS. 2A and 2B illustrate a plurality of vias 202. Vias 202 are a portion of finned section 102 adjacent thermal material 104. In this embodiment, vias 202 are formed between grooves 112 of finned section 102 and are aligned with fins 108. Vias 202 provides thermal coupling between finned section 102 and thermal material 104 as explained below.

TPG is oriented in strips 110 such that the plane of high thermal conductivity (a-b plane 204) is parallel to base 106. Thus, the TPG propagates heat along the a-b plane and thermal transfer occurs where edges 206 of a-b plane of thermal material 104 come into contact with finned section 102. Since TPG has a low thermal conductivity in the c direction 208, vias 202 provide a c-direction path for heat to travel between finned section 102 and thermal material 104. Vias 202 are aligned with fins 108, thus heat propagating through strips 110 has a direct path to fins 108. In an alternative embodiment, strips 110 of thermal material 104 are aligned with fins 108.

In operation, TPG acts to increase the efficiency of fins 108 through passive heat spreading. Heat accumulated by base 106 is transferred to finned section 102 through surface to surface contact with vias 202 as shown in FIGS. 2A and 2B. Once the heat reaches vias 202 of finned section 102, some of the heat propagates directly to fins 108. Additionally, some of the heat propagates from vias 202 into thermal material 104 through contact with edges 202. Once the heat enters thermal material 104, the heat rapidly propagates along thermal material 104. As heat travels along each strip 110 of thermal material 104, heat is transferred back into finned section 102. The heat then propagates through finned section 102 into fins 108 through vias 202. From fins 110, the heat is dissipated to the environment.

As shown in FIGS. 2A and 2B strips 110 of thermal material 104 have generally rectangular cross-sections, which allows for easy manufacture with an adequate edge 204 size. In other embodiments, however, the cross-section of strips 110 has a triangular, semi-circular, or other shape. Further, although FIG. 2B illustrates vias 202 as being substantially similar in width to fins 108, other embodiments of heat sink 100 include vias 202 having widths large or smaller than that of fin 108, due to wider, narrower, or irregularly spaced strips 110. Finally, the depth of strips 110 can be modified according the amount of heat propagation needed or desired for a particular application.

Referring back to FIG. 1, to further improve heat spreading, in one embodiment, heat sink 100 also includes at least one cross strip (not shown) of thermal material 104 perpendicular to strips 110. Finned section 102 as shown in FIG. 1 has a plurality of cross grooves 116 for housing a plurality of cross strips of thermal material 104. Cross strips of thermal material 104 thermally couple adjacent strips 110 of thermal material 104. Cross strips, therefore, facilitate lateral heat transfer across finned section 102, and between different fins 108 of finned section 102. Without cross strips of thermal material 104, strips 110 of thermal material 104 allow heat to propagate 1-dimensionally along finned section 102 in a direction parallel with fins 108. Cross strips of thermal material 104, therefore, allow heat to propagate between strips 110 and thus facilitate 2-dimensional spreading across finned section 102. In one embodiment, thermal material 104 includes a plurality of cross strips which, along with strips 110, form a grid of thermal material 104.

As heat propagates through strips 110 and comes into contact with a cross strip of thermal material 104, the heat can propagate along the cross strip to other strips 110 of thermal material and along other fins 108. Lateral heat propagation can be increased by increasing the number of cross strips. Thus, although four (4) cross grooves 116 are shown in FIG. 1, the number of cross grooves 116, and associated cross strips can be increased or decreased to increase or decrease the lateral propagation of heat.

Figure 3:
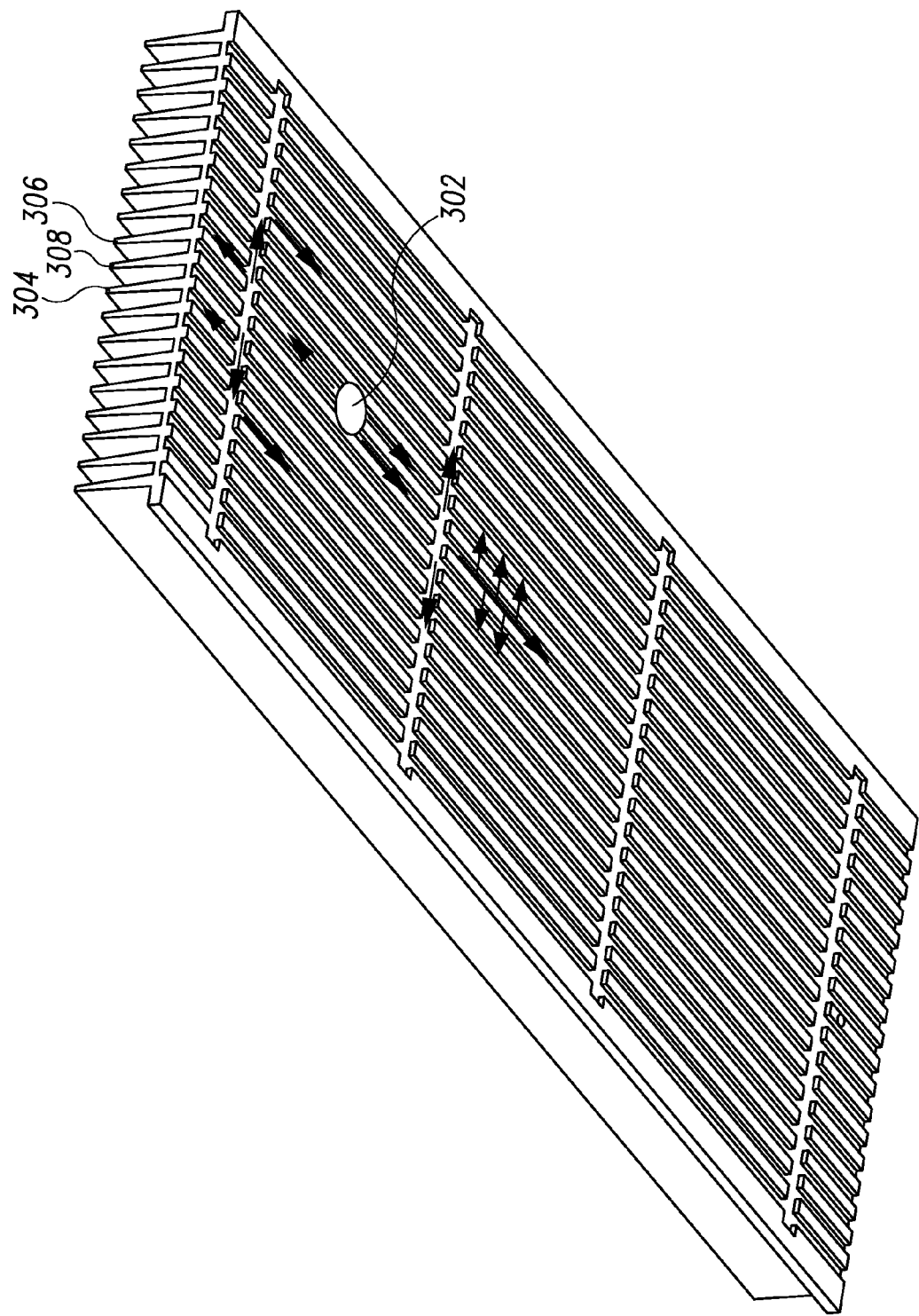
FIG. 3 is a perspective view of one embodiment of the heat sink of FIG. 1.

FIG. 3 illustrates a cross-sectional view of one embodiment of heat sink 100. FIG. 3 shows one example of the heat spreading process of heat sink 100. A hot spot 302 in finned section 102 is formed by, for example, an electronic device emitting heat to finned section 102. Some heat from hot spot 302 dissipates directly through finned section 102 and into fins 304, 306, 308. The rest of the heat is transferred into adjacent thermal material 104. Once the heat enters thermal material 104, the heat rapidly propagates along each strip 110 of thermal material 104. The heat is then transferred back into finned section 102 along edge 202 between the strips 110 of thermal material 104 and finned section 102. Generally, the heat from thermal material 104 transfers into finned section 102 at a point having less heat than hot spot 302. Thus, thermal material 104 passively spreads the heat from warmer to cooler points along finned section 102, increasing the efficiency of fins 108 by evenly distributing the heat along fins 108.

Advantageously, the design of heat sink 100 is economical to manufacture. For example, the orientation of grooves 112 and fins 108 as parallel to each other allows finned section 102 to be made through an extrusion process and include both grooves 112 and fins 108. As shown in FIG. 1, only the apertures for fasteners 114 and cross grooves 116 require machining. Thus, in an alternative embodiment, cross grooves 116 are not included in finned section 102 to reduce the cost of manufacturing. Additionally, since finned section 102 is formed by extrusion, heat sink 100 can easily be manufactured at different sized for different applications. This is because the length of finned section 102 can be cut at any length according the needed or desired application.

As described above, some embodiments of heat sink 100 provide further economical benefits, because heat sink 100 has a generic thermal design that can be applied to many different layouts of heat generating devices. For example, one embodiment of heat sink 100 the plurality of strips 110 are positioned on substantially all of finned section 102. Further, in this embodiment, finned section 102 is substantially larger than an area of heat generated by one or more devices. Since strips 110 are positioned on substantially all of finned section 102, strips 110 will spread heat from one or more heat generating devices regardless of where the devices are coupled to base 106. To further improve the ability to accommodate varying locations of heat devices, an alternative embodiment of heat sink 100 includes cross strips 116, such that thermal material 104 forms a grid. The grid of thermal material 104 enables heat spreading regardless of the location of one or more heat generating devices. Advantageously, the more closely spaced that the cross strips 116 are, the more likely it is that a device mounted on base 106 will be near to a cross strip 116. Thus, the more closely spaced the cross strips 116, the more accommodating heat sink 100 is to differing device layouts. The space between cross strips 116 is limited, however, by the requirement for vias 202 to transfer heat between finned section 102 and thermal material 104.

Although FIGS. 1, 2A, 2B, and 3 illustrate an embodiment of heat sink 100 having strips 110 of thermal material 104 oriented parallel with fins 108, other orientations of strips 110 could be used. For example, in an alternative embodiment, strips 110 of thermal material 104 are parallel to each other, and are angled at 45 degrees with respect to fins 108. Thus, each strip 110 facilitates propagation of heat partially in a lateral direction across multiple fins, and also facilitates propagation partially along the length of fins 108. In another alternative embodiment, strips 110 are parallel with fins 108 as shown in FIG. 1, and cross cuts 116 run diagonal across strips 110. In yet other embodiments, the placement and orientation of strips 110 and/or cross strips 116 is customized to match a particular fin design and/or design layout.

Although for some embodiments, thermal material 104 has been described as TPG, the present invention is not intended to be so limited and can include other thermal materials. For example, in one embodiment, thermal material 104 is copper. Copper allows equal heat propagation in all directions. Thus, heat can propagate along the strips 110 of copper and can couple into vias 202 as well as into finned section 102 above strips 110. When copper is used, for example, strips 110 may be aligned with fins 108. In another embodiment, thermal material 104 is a heat pipe. Alternatively, thermal material 104 can be other materials having a high in-plane conductivity, such as diamond-like-carbon (DLC) or diamond or any material having thermal conductivities higher than the material of finned section 102.

Although specific embodiments have been illustrated and described herein, it will be appreciated by those of ordinary skill in the art that any arrangement, which is calculated to achieve the same purpose, may be substituted for the specific embodiment shown. This application is intended to base any adaptations or variations of the present invention. Therefore, it is manifestly intended that this invention be limited only by the claims and the equivalents thereof.

What is claimed is:

1. An apparatus for spreading heat over a plurality of fins, the apparatus comprising:
   a heat dissipating member composed of metal and having a plurality of fins on a first side of the heat dissipating member;
   a plurality of strips of thermal material having a thermal conductivity in a direction parallel to the length of the strip higher than a thermal conductivity of the heat dissipating member, the plurality of strips disposed on a side of the heat dissipating member opposite of the first side and configured to spread heat along the heat dissipating member; and
   a plurality of vias between each of the plurality of strips, wherein each of the plurality of vias is substantially aligned with a respective one of the plurality of fins.

2. The apparatus of claim 1, wherein the thermal material is thermal pyrolytic graphite.

3. The apparatus of claim 1, wherein the plurality of strips of thermal material are oriented parallel at least two of the plurality of fins.

4. The apparatus of claim 1, wherein each fin of the plurality of fins is oriented parallel to each other fin.

5. The apparatus of claim 1, wherein each strip of the plurality of strips is oriented parallel to each other strip.

6. The apparatus of claim 5, further comprising:
   at least one cross strip of thermal material, the cross strip disposed on the side of the heat dissipating member opposite of the first side and oriented perpendicular to the plurality of strips of thermal material.

7. The apparatus of claim 1, wherein each of the plurality of strips has a generally rectangular cross section.

8. The apparatus of claim 1, further comprising:
   a base configured to fasten to the heat dissipating member, wherein the plurality of strips of thermal material are disposed between the base and the heat dissipating member.

9. The apparatus of claim 1, wherein the plurality of strips are disposed across the entire heat dissipating member.

10. The apparatus of claim 1, wherein the heat dissipating member is aluminum.

11. The apparatus of claim 1, wherein the thermal material is copper.

12. An apparatus for dissipating heat, the apparatus comprising:
    a heat dissipating member composed of metal, the heat dissipating member comprising:
       a plurality of fins;

a plurality of grooves on a side opposite the plurality of fins, the plurality of grooves parallel to each other; and a plurality of vias between each of the plurality of grooves;

a plurality of strips of thermal material, each of the plurality of strips located in one of the plurality of grooves, each of the plurality of strips thermally coupled to at least one of the plurality of vias; and a base composed of metal, the base covering the plurality of strips, the base member thermally coupled to at least one of the plurality of vias.

13. The apparatus of claim 12, wherein the thermal material is thermal pyrolytic graphite.

14. The apparatus of claim 12, wherein the plurality of strips of thermal material are oriented parallel at least two of the plurality of fins.

15. The apparatus of claim 12, wherein at least one of the plurality of vias is substantially aligned with at least one of the plurality of fins.

16. The apparatus of claim 12, wherein each of the plurality of vias is substantially aligned with each of the plurality of fins.

17. The apparatus of claim 12, wherein each fin of the plurality of fins is oriented parallel to each other fin.

18. The apparatus of claim 1, wherein each strip of the plurality of strips is oriented parallel to each other strip.

19. The apparatus of claim 1, further comprising:

at least one cross strip of thermal material, the cross strip on the side opposite of the plurality of fins and oriented perpendicular to the plurality of strips of thermal material.

20. The apparatus of claim 12, further comprising:

a plurality of cross strips of thermal material, the cross strips on the side opposite of the plurality of fins and oriented perpendicular to the plurality of strips of thermal material, wherein the plurality of strips and the plurality of cross strips form a grid pattern.

21. The apparatus of claim 12, wherein each of the plurality of strips has a generally rectangular cross section.

22. The apparatus of claim 12, wherein the plurality of strips are disposed across the entire heat dissipating member.

23. An apparatus for spreading heat across a plurality of fins, the apparatus comprising:

a heat dissipating member composed of metal, the heat dissipating member comprising:

a plurality of fins oriented parallel to each other; and a plurality of grooves on a side opposite the plurality of fins, the plurality of grooves oriented parallel to the plurality of fins, each of the plurality of grooves disposed opposite a valley between adjacent fins of the plurality of fins;

a plurality of strips of thermal material, each of the plurality of strips disposed in one of the plurality of grooves, each of the plurality of strips thermally coupled to the heat dissipating member along an edge of its respective groove of the plurality of grooves; and a base composed of metal, the base configured to fasten to the heat dissipating member, wherein the plurality of strips of thermal material are disposed between the base and the heat dissipating member.

24. The apparatus of claim 23, wherein the thermal material is thermal pyrolytic graphite.

\* \* \* \* \*